United States Patent [19]

Uchino et al.

[11] Patent Number: 4,983,500

[45] Date of Patent: Jan. 8, 1991

[54] RADIATION IMAGING PROCESS FOR FORMATION OF CONTRAST ENHANCED PATTERN USING TWO PHOTOSENSITIVE DIALONIUM SALT LAYERS WITH REMOVAL OF OVERLAYER AND DEVELOPED RESIST PATTERN IN UNDERLAYER

[75] Inventors: Shouichi Uchino, Hachioji; Takao Iwayanagi, Tokyo; Michiaki Hashimoto, Sayama, all of Japan

[73] Assignee: Hitachi, Ltd., Tokyo, Japan

[21] Appl. No.: 260,747

[22] Filed: Oct. 21, 1988

[30] Foreign Application Priority Data

Oct. 30, 1987 [JP] Japan ................................ 62-273145

[51] Int. Cl.$^5$ ...................... G03F 7/016; G03F 7/021; G03F 7/32
[52] U.S. Cl. .................................. 430/325; 430/169; 430/176; 430/198; 430/311; 430/312; 430/326; 430/327; 430/329
[58] Field of Search ................ 430/326, 327, 329, 311, 430/312, 169, 198, 325, 176

[56] References Cited

U.S. PATENT DOCUMENTS 3,443,944  5/1969  Wise ...................................... 430/198
3,733,200  5/1973  Takaishi et al. ...................... 430/169
4,217,407  8/1980  Watanabe et al. ................... 430/326
4,663,275  5/1987  West et al. ............................ 430/311
4,784,936  11/1988  White et al. ......................... 430/311

FOREIGN PATENT DOCUMENTS 161660   11/1985  European Pat. Off. ............ 430/312
1493833  11/1977  United Kingdom ................ 430/160
1493834  11/1977  United Kingdom ................ 430/160

OTHER PUBLICATIONS

Research Disclosure, No. 13928, Nov. 1975, pp. 21, 22.

*Primary Examiner*—Charles L. Bowers, Jr.
*Attorney, Agent, or Firm*—Pennie and Edmonds

[57] ABSTRACT

Disclosed is a radiation sensitive composition which comprises a radiation sensitive compound decreased in absorption of radiation upon irradiation with radiation and an organic polymer which, upon being formed into a film, changes in its solubility and decreases in solubility in a desired solvent due to the presence of decomposition product of said radiation sensitive compound which is produced by irradiation with the radiation. A process of formation of pattern using said composition is also disclosed. Fine resist pattern of 0.5 μm line-and-space patterns or less can be formed with sufficiently high contrast.

18 Claims, No Drawings

RADIATION IMAGING PROCESS FOR FORMATION OF CONTRAST ENHANCED PATTERN USING TWO PHOTOSENSITIVE DIALONIUM SALT LAYERS WITH REMOVAL OF OVERLAYER AND DEVELOPED RESIST PATTERN IN UNDERLAYER

BACKGROUND OF THE INVENTION

The present invention relates to a radiation sensitive composition which is insolubilized by radiations such as light, electron beam and X-ray and a process for formation of patterns using the composition.

Reduction projection exposure is mainly employed for photolithography in preparation of integrated circuits and large scale integrated circuits. When reduction projection exposure is employed, if size of pattern to be formed is in the submicron area, contrast of aerial image of light which has passed through an optical system is decreased even if contrast of mask pattern is high. As an approach to improve this reduction in contrast, for example, Japanese Patent Kokai No. 59-104642 has proposed a process for formation of resist pattern wherein a layer containing an aryl nitrone compound is formed on a photoresist film, thereby to enhance contrast of image which has been reduced in contrast due to exposure system. However, this process does not give consideration to deformation of pattern caused by reflected light from substrate and that caused by light absorption by the photoresist per se and thus has suffered from the problem of reduction in resolution. The photoresist also senses the reflected light from substrate, resulting in inferior shape of pattern. When absorption by the photoresist per se is great, light absorption occurs at the upper part of the photoresist film and the resulting pattern has section of reversed trapezoid (in case of negative type) In both the cases, resolution is deteriorated.

SUMMARY OF THE INVENTION

The object of the present invention is to provide a radiation sensitive composition which can afford images of high resolution and contrast and a process for formation of pattern using this composition The above object can be attained by a radiation sensitive composition which comprises a radiation sensitive compound decolored by irradiation of radiation (decrease in absorption of the radiation) and an organic polymer which, upon being formed into a film, becomes insoluble or sparely soluble in a desired solvent with changing in solubility due to the presence of decomposition product of said radiation sensitive compound and by a process for formation of pattern using said composition.

DETAILED DESCRIPTION OF THE PREFERRED EMBODIMENTS

The radiation sensitive composition of the present invention is sufficiently high in absorption of radiation before irradiation with radiation, but decreases in absorption of radiation upon irradiation with radiation such as light, electron beam or X-ray Therefore, light irradiated from above can reach to lower part of coated film of the composition and besides the reflected light from substrate does not cause deformation of pattern. Thus, pattern of high resolution can be obtained. It has been well known that diazonium salts decrease in absorption of radiation, particularly light, upon irradiation with radiation.

The radiation sensitive composition of the present invention may be coated on a substrate as a solution comprising a mixture of an organic polymer and a radiation sensitive compound to form a film on the substrate. However, when an alkali soluble phenolic resin such as, for example, novolac resin, cresol novolac resin or polyvinyl phenol is chosen as the organic polymer and a diazonium salt is chosen as the radiation sensitive compound and these are coated in the above manner, phase separation is apt to occur and uniform film is difficult to obtain and besides the solution comprising a mixture of them is readily decomposed and is unstable. In such case, it is preferred to form the film by the following method. That is, firstly, a coating film of the organic polymer is formed on a substrate by usual method such as rotational coating method and then this film is allowed to contact with a solution containing the daizonium salt whereby the solution diffuses into the film to give a film comprising a substantially homogeneous mixture of the diazonium salt and the organic polymer. This method solves the above mentioned problem that a solution containing diazonium salt and phenolic resin is unstable Amount of diazonium salt contained in the coating film is determined by concentration of diazonium salt in the solution and time for contacting the solution with the film, but in many cases, the diazonium salt rapidly reaches nearly saturation concentration in the coating film.

Concentration of radiation sensitive compound is preferably 10-50% by weight, more preferably 12-25% by weight of organic polymer. When the concentration is less than 10% by weight, various problems occur in insolubilization of coating film and when more than 50% by weight, absorption of light is too strong and light is difficult to reach the lower part of the film.

In case of the coating film of phenolic resin being allowed to contact with solution of diazonium salt as mentioned above, it is preferred to use a mixed solvent of acetic acid and water as a solvent. Acetic acid is a good solvent for phenolic resin and water does not dissolve phenolic resin. Use of them in admixture makes it possible to incorporate diazonium salt into the film of phenolic resin without dissolving phenolic resin. Proportion of acetic acid to water in the mixed solvent is preferably 10-90% by weight, more preferably 20-80% by weight. If the proportion is less than 10% by weight, diffusion of diazonium salt does not occur at all and if more than 90% by weight, phenolic resin is partially dissolved and this is not desirable. This value may vary depending on resin and, for example, polyvinyl phenol is easily dissolved in acetic acid and so a range of 10-30% by weight is preferred.

The diazonium salts are preferably aromatic diazonium salts and especially preferably in the form of diazonium chloride zinc chloride double salts, diazonium fluoroborate, diazonium sulfonate, diazonium sulfate, diazonium aromatic sulfonate or the like. Moreover, 5-diazo-meldrum's acid may also be used. Aromatic diazonium salts represented by the following general formulas are especially preferred because they have high decomposition efficiency by irradiation of radiation.

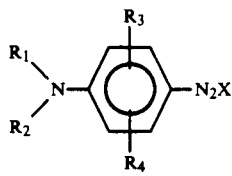

(wherein $R_1$, $R_2$, $R_3$ and $R_4$ each represents a hydrogen atom, an alkyl group, an alkoxy group, an aryl group or a halogen atom and X represents Cl, $BF_4$, $SO_3H$, $HSO_4$, $PF_6$, $1/2SO_4$ of an aromatic sulfonic acid).

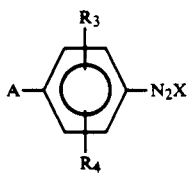

(wherein A represents an alkoxy group, pyrrolidino group or a morpholino group and $R_3$, $R_4$ and X have the same meanings as above). When X is Cl, they are preferably used as double salts with zinc chloride When A is an alkoxy group, the carbon number thereof is preferably 1 or 2.

Thickness of the base resin layer is preferably 0.3-2.0 μm, more preferably 0.5-1.5 μm. If the layer is too thick, high resolution is difficult to obtain and if too thin, pinholes are apt to be formed in the film.

The composition of the present invention may contain an azide compound. As well known, a composition of an azide compound and phenolic resin is a negative type photoresist. The composition of the present invention exhibit the action different from that of photoresist. Therefore, amount of the azide compouns is preferably less than that contained as ordinary photoresists. Preferred amount of the azide compound is 5-10% by weight of organic polymer.

One example of preferred azide compound is a bisazide compound represented by the following general formula.

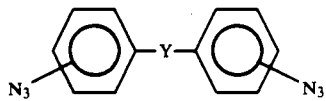

(wherein Y represents a substituent indicated by $-SO_2-$, $-CH_2-$, $-S-$ or $-CO-$).

Other bisazide compounds, for example, 3,3'-dimethoxy-4,4'-diazidobiphenyl may also be used.

As mono-azide compounds, compounds having an azide group in aromatic ring are preferred. Especially preferred are 3-(4-azidostyryl)-5,5-dimethyl-2-cyclohexene-1-on, 4-azido-2'-methoxycalcone, 4-azido-4'-methoxycalcone, 4-N,N-dimethylamino-4'-azidocalcone, 3-(4-(p-azidophenyl)-1,3-butadienyl)-5,5-dimethyl-2-cyclohexene-1-on and the like.

The process for forming a pattern using the composition of the present invention includes, for example, a process which uses a coating film of two-layer structure as explained below. This process comprises first forming a coating film of the composition of the present invention on a substrate (this film is referred to as "bottom polymer layer" and the polymer in this layer is referred to as first organic polymer, hereinafter), forming thereon a layer comprising said radiation sensitive compound and a second organic polymer (this layer is referred to as "photosensitive layer" hereinafter) to form a coating film of two-layer structure, subjecting this film to pattern exposure, then removing the photosensitive layer and developing the bottom polymer layer. Removal of photosensitive layer and development can be effected simultaneously if proper solvent is chosen.

The radiation sensitive compound may be different in photosensitive layer and bottom polymer layer, but preparation is easier when same compound is used in both layers. The above process is carried out preferably in the following manner. That is, a coating film of organic polymer is formed on a substrate and a solution containing a second organic polymer and radiation sensitive compound is placed on said coating film. The radiation sensitive compound diffuses into the film to form bottom resin layer. Excess solution is removed by, for example, rotating the substrate by a spinner to form a photosensitive layer comprising the remaining radiation sensitive compound and the second organic polymer. Thereafter, pattern exposure, removal of photosensitive layer and development are carried out.

The second organic polymer is preferably soluble in a solvent which does not dissolve the organic polymer in the bottom resin layer. This is because the bottom resin layer must not be dissolved in the solution of the second organic polymer for preparing a coating film of two-layer structure by the process as mentioned above. The second organic polymers are preferably polymers high in permeability to nitrogen gas generated due to photo-decomposition of diazonium salt upon exposure. Especially preferred are poly(N-vinylpyrrolidone), copolymer of N-vinylpyrrolidone-vinyl acetate, copolymer of acrylamide-diacetonacrylamide and copolymer of methylvinyl ether-maleic anhydride.

With reference to proportion of the radiation sensitive compound and the second organic polymer in the photosensitive layer, the proportion of the radiation sensitive compound is preferably 80% by weight or more for increasing optical density of the photosensitive layer. However, if the proportion of radiation sensitive compound exceeds 200% by weight, the radiation sensitive compound is apt to be crystallized in the photosensitive layer and thus proportion of radiation sensitive compound to the second organic polymer is preferably 80-200% by weight.

Thickness of photosensitive layer is preferably 0 2-1.0 μm, more preferably 0.4-0.7 μm. When the layer is too thick, resolution decreases and when too thin, pinholes are readily formed.

Removal of photosensitive layer and development of bottom polymer layer may be carried out separately or simultaneously. When photosensitive layer is water-soluble and bottom polymer layer can be developed with an alkali solution, photosensitive layer can be removed simultaneously with development.

The composition of the present invention shows high resolution because radiation sensitive compound is decomposed by radiation to cause bleaching and besides it is hardly influenced by reflected light from substrate. It is considered that the action of the composition to insolubilize the coating film is based on that decomposition product of the radiation sensitive compound becomes insoluble or sparely soluble in many solvents and prevents dissolution of the organic polymer. In some cases, the portion which is irradiated with radiation is also dissolved in solvents which are high in dissolvability of organic polymer.

Furthermore, in case of coating film being of two-layer structure, the upper photosensitive layer serves as a contrast enhancing layer, resulting in higher contrast.

Contrast and pattern of the prior art were γ value 2 and 0.6 μm line-and-space patterns, respectively. Therefore, the superiority of the present invention over the prior art will be easily understandable from the following examples.

EXAMPLE 1

A 20 wt% solution of phenolic resin (Alnovol PN430 supplied by Hoechst Co.) in ethyl cellosolve acetate was coated on a silicon wafer substrate to form a film of 0.7 μm in thickness and the film was prebaked at 80° C. for 1 minute. An aqueous acetic acid solution of the following composition 1 was dropped on this film and spread on the whole surface thereof and allowed to stand for 1 minute. As a result, diazonium compound was doped in the film to form a bottom polymer layer.

Then, spinner was rotated and a solution of diazonium compound and polyvinyl pyrrolidone in aqueous acetic acid solution was coated on said bottom polymer layer and dried to form a photosensitive layer containing the diazonium compound and polyvinyl pyrrolidone on the bottom polymer layer. Thickness of the photosensitive layer was 0.5 μm.

Thus formed coating film of two-layer structure was subjected to pattern exposure using Hitachi: i-line reduction projection aligner and thereafter the photosensitive layer was removed by washing with water.

Then, the bottom polymer layer was subjected to development with 2.38 wt% aqueous tetramethylammonium hydroxide solution for 30 seconds to obtain a resist pattern comprising 0.5 μm line-and-space patterns with high accuracy. Exposure quantity required was nearly the same as for exposure of ordinary positive type resist and contrast in terms of γ value was more than about 4, which was more than twice that obtained by conventional method.

| Composition 1: | |
|---|---|
| 4-(N,N-dimethylamino)-benzene diazonium chloride zinc chloride double salt (No. 1 in the following Table 1) | 7.5% |
| N-vinylpyrrolidone-vinyl acetate copolymer | 5% |
| Acetic acid | 45% |
| Water | 42.5% |

EXAMPLE 2

Pattern was formed in the same manner as in Example 1 except that diazonium salts of Nos. 2-11 enumerated in Table 1 were used in place of the diazonium salts used in Example 1. All of the diazonium salts of Nos. 2-11 resulted in fine patterns with contrast of γ value 4, 0.5 μm line-and-space patterns and high resolution.

TABLE 1

| No. | Chemical Name | Structural formula |
|---|---|---|
| 1 | 4-(N,N-dimethylamino)-benzenediazonium chloride zinc chloride double salt | 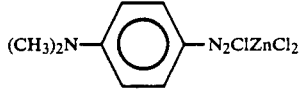 |
| 2 | 4-(N,N-diethylamino)-benzenediazonium chloride zinc chloride double salt | 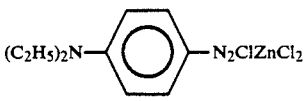 |
| 3 | 4-(N,N-di-n-propylamino)-benzenediazonium chloride zinc chloride double salt |  |
| 4 | 4-(N,N-dimethylamino)-2-methoxy-benzenediazonium chloride zinc chloride double salt | 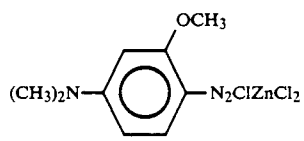 |
| 5 | 4-(N,N-dimethylamino)-2-methylbenzenediazonium chloride zinc chloride double salt | 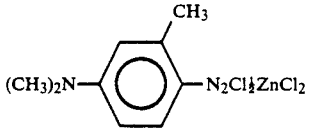 |
| 6 | 4-(N,N-diethylamino)-2-methylbenzenediazonium chloride zinc chloride double salt | 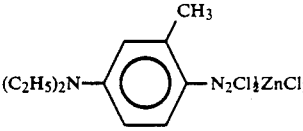 |

TABLE 1-continued

| No. | Chemical Name | Structural formula |
|---|---|---|
| 7 | 4-(N-ethyl,N-hydroxyethylamino)-benzenediazonium chloride zinc chloride double salt | $C_2H_5-N(C_2H_4OH)-C_6H_4-N_2Cl \cdot \frac{1}{2}ZnCl_2$ |
| 8 | 4-(N,N-dimethylamino)-2,5-dimethyl-benzenediazonium chloride zinc chloride double salt | $(CH_3)_2N-C_6H_2(CH_3)_2-N_2Cl \cdot \frac{1}{2}ZnCl_2$ |
| 9 | 4-(N,N-dimethylamino)-2,5-dimethyl-benzenediazonium tetrafluoroborate | $(CH_3)_2N-C_6H_2(CH_3)_2-N_2BF_4$ |
| 10 | 4-(N,N-dimethylamino)-2,6-dimethyl-benzenediazonium chloride zinc chloride double slat | $(CH_3)_2N-C_6H_2(CH_3)_2-N_2Cl \cdot \frac{1}{2}ZnCl_2$ |
| 11 | 4-(N,N-diethylamino)2-ethoxybenzene-diazonium toluenesulfonate | $(C_2H_5)_2N-C_6H_3(OC_2H_5)-N_2SO_3-C_6H_4-CH_2$ |
| 12 | 4-Methoxybenzenediazonium tetrafluoroborate | $CH_2O-C_6H_4-N_2BF_4$ |
| 13 | 4-Methoxybenzenediazonium zinc chloride double salt | $CH_3O-C_6H_4-N_2Cl \cdot \frac{1}{2}ZnCl_2$ |
| 14 | 4-Ethoxybenzenediazonium tetrafluoroborate | $C_2H_5O-C_6H_4-N_2BF_4$ |

EXAMPLE 3

Patterns were formed in the same manner as in Example 1 except that diazonium salts of Nos. 12–14 shown in Table 1 were used in place of the diazonium salts used in Example 1 and contact exposure was effected through an interference filter of 315 nm by ultra-high pressure Xe-Hg lamp in place of the i-line reduction projection aligner. All of the diazonium salts of Nos. 12–14 gave fine patterns with contrast of γ value 4 and with 0.5 μm line-and-space patterns.

EXAMPLE 4

A pattern was formed in the same manner as in Example 1 except that a coating film composed of phenolic resin (Alnovol PN430) and 3-(4-azidostyryl)-5,5 dimethyl-2-cyclohexene-1-on in an amount of 10% by weight of the phenolic resin was used in place of the coating film used in Example 1. Fine pattern of contrast of γ value 4 and of 0.5 μm line-and-space patterns was formed.

EXAMPLE 5

Patterns were formed in the same manner as in Example 3 except that a coating film composed of phenolic resin (Alnovol PN430) and 3,3'-dimethoxy-4,4'-diazidobiphenyl in an amount of 10% by weight of the phenolic resin was used in place of the coating film used in Example 3. Fine patterns of contrast of γ value 4 and of 0.5 μm line-and-space patterns were formed.

EXAMPLE 6

A pattern was drawn with electron ray by Hitachi: electron ray drawing device on a coating film of two-layer structure formed by the same method as in Example 1, followed by developing by the same method as in Example 1. The resulting fine pattern had 0.5 μm line-and-space patterns and contrast of γ value 4.

EXAMPLE 7

Pattern was formed in the same manner as in Example 1 except that the diazonium salt of No. 8 in Table 1 was used in place of the diazonium salt used in Example 1, the coating film composed of phenolic resin (Alnovol PN430) and 3-(4-(p-azidophenyl)-1,3-butadienyl)-5,5-dimethyl-2-cyclohexene-1-on in an amount of 10% by weight of the phenolic resin was used as a coating film and a g-line reduction projection aligner was used in place of the i-line reduction projection aligner. The resulting fine pattern had 0.5 μm line-and-space patterns with contrast of γ value 4. Developing time was 120 seconds.

What is claimed is:

1. A process for forming a pattern on a substrate which comprises the steps of:
    (a) forming a layer of first organic polymer comprising an alkali-soluble film of a phenolic resin on the substrate, said film having thickness of 0.3–2.0 μm;
    (b) forming a first radiation sensitive film on said substrate by coating said phenolic resin film with a solution containing an aromatic diazonium compound comprising a photosensitive diazonium salt and a second organic polymer which is water-soluble and possesses high permeability to nitrogen gas generated due to photodecomposition of said diazonium salt upon exposure to radiation to dope said aromatic diazonium compound into said phenolic resin;
    (c) forming a second photosensitive film by mixing the solution containing the water-soluble second organic polymer and the aromatic diazonium compound containing said photosensitive diazonium salt which remains on said first radiation sensitive film after doping the diazonium salt into said phenolic resin, said second photosensitve film having thickness of 0.2–1.0 μm;
    (d) selectively irradiating predetermined areas of said first radiation sensitive film through said second photosensitive film to decrease in solubility in a developer for said first radiation sensitive film; and
    (e) removing said second photosensitive film and then developing said first radiation sensitive film, or simultaneously removing said second photosensitive film and developing said first radiation sensitive film to remove portions of said first radiation sensitive film which have not been irradiated to form a resist pattern possessing high resolution and contrast caused by the second radiation sensitive film functioning as a contrast enhancement composition.

2. A process according to claim 1, wherein the phenolic resin is selected from the group consisting of novolak resin, cresol novolak resin, and polyvinyl phenolic resin.

3. A process according to claim 1, wherein the aromatic diazonium salt is selected from the group consisting of diazonium chloride zinc chloride double salt, diazonium fluoroborate, diazonium sulfonate, diazonium sulfate, diazonium aromatic sulfonate, and diazomeldrum's acid.

4. A process according to claim 1, wherein the aromatic diazonium salt is represented by the following formula:

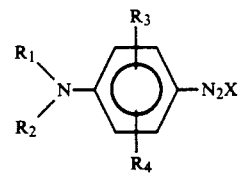

wherein $R_1$, $R_2$, $R_3$ and $R_4$ each represents a hydrogen atom, an alkyl group, an alkoxy group, an aryl group or a halogen atom and X represents Cl, $BF_4$, $SO_3H$, $HSO_4$, $PF_6$, $1/2SO_4$ or an aromatic sulfonic acid.

5. A process according to claim 1, wherein the aromatic diazonium salt is represented by the following formula:

$$A-\underset{R_4}{\overset{R_3}{\bigcirc}}-N_2X$$

wherein A represents an alkoxy group, a pyrrolidino group or a morpholino group, $R_3$ represents an alkoxy group, $R_4$ represents an aryl group or a halogen atom and X represents Cl, $BF_4$, $SO_3H$, $HSO_4$, $PF_6$, $1/2SO_4$ or an aromatic sulfonic acid.

6. A process according to claim 1, wherein content of the the aromatic diazonium compound is 10–50% by weight of the phenolic resin.

7. A process according to claim 6, wherein the content of the aromatic diazonium compound is 15–25% by weight of the phenolic resin.

8. A process according to claim 1, wherein the thickness of the phenolic resin film is 0.5–1.5 μm.

9. A process according to claim 1 wherein thickness of the photosensitive layer is 0.2–1.0 μm.

10. A process according to claim 1, wherein the thickness of the second photosensitive film is 0.4–0.7 μm.

11. A process according to claim 1, wherein content of the diazonium compound is 80–200% by weight of the second organic polymer.

12. A process according to claim 1, wherein the second organic polymer is a polymer selected from the group consisting of poly(N-vinylpyrrolidone), copolymer of N-vinylpyrrolidone and vinyl acetate, copolymer of acrylamide and diacetoneacrylamide, and copolymer of methylvinyl ether and maleic anhydride.

13. A process according to claim 1, wherein the first radiation sensitive film additionally contains an azide compound.

14. A process according to claim 13, wherein content of the azide compound is 5–10% by weight of the phenolic resin.

15. A process according to claim 1, wherein the solution containing said second organic polymer and said aromatic diazonium compound is prepared by dissolving said aromatic diazonium compound and said second organic polymer in acetic acid and water.

16. A process according to claim 1, wherein said second photosensitive film is formed by removing excess solution containing said aromatic diazonium compound after formation of said first radiation sensitive film.

17. A process according to claim 1, wherein said second photosensitive film is removed by washing with water.

18. A process according to claim 1, wherein said first radiation sensitive film is developed with an aqueous solution of tetramethylammonium hydroxide.

* * * * *